United States Patent
Shuey

(10) Patent No.: US 8,379,355 B2
(45) Date of Patent: Feb. 19, 2013

(54) SYSTEM AND METHOD FOR DETECTING THE PRESENCE OF AN UNSAFE LINE CONDITION IN A DISCONNECTED POWER METER

(75) Inventor: Kenneth C. Shuey, Zebulon, NC (US)

(73) Assignee: Elster Electricity LLC, Raleigh, NC (US)

( * ) Notice: Subject to any disclaimer, the term of this patent is extended or adjusted under 35 U.S.C. 154(b) by 133 days.

(21) Appl. No.: 13/080,290

(22) Filed: Apr. 5, 2011

(65) Prior Publication Data

US 2011/0181268 A1 Jul. 28, 2011

Related U.S. Application Data

(63) Continuation of application No. 11/710,837, filed on Feb. 26, 2007, now abandoned.

(51) Int. Cl.
*H02H 3/00* (2006.01)

(52) U.S. Cl. ......................................................... 361/86

(58) Field of Classification Search .................. None
See application file for complete search history.

(56) References Cited

U.S. PATENT DOCUMENTS

| | | |
|---|---|---|
| 4,190,800 A | 2/1980 | Kelly, Jr. et al. |
| 4,240,030 A | 12/1980 | Bateman et al. |
| 4,301,444 A | 11/1981 | Bruckert et al. |
| 4,331,915 A | 5/1982 | Fielden |
| 4,357,601 A | 11/1982 | McWilliams |
| 4,532,471 A | 7/1985 | Hurley |
| 4,540,984 A | 9/1985 | Waldman |
| 4,565,995 A | 1/1986 | Stokes |
| 4,571,691 A | 2/1986 | Kennon |
| 4,583,043 A | 4/1986 | Phillips |
| 4,656,593 A | 4/1987 | Gleba et al. |
| 4,680,706 A | 7/1987 | Bray |
| 4,707,679 A | 11/1987 | Kennon et al. |
| 4,727,315 A | 2/1988 | Jones |
| 4,764,952 A | 8/1988 | Feliu |
| 4,850,010 A | 7/1989 | Stanbury et al. |
| 4,977,515 A | 12/1990 | Rudden et al. |

(Continued)

FOREIGN PATENT DOCUMENTS

| | | |
|---|---|---|
| EP | 0085769 | 8/1983 |
| GB | 2225867 | 6/1990 |

(Continued)

OTHER PUBLICATIONS

International Patent Application No. PCT/US2008/002153, International Search Report dated Jul. 8, 2008.

(Continued)

*Primary Examiner* — Rexford Barnie
*Assistant Examiner* — Ann Hoang
(74) *Attorney, Agent, or Firm* — Woodcock Washburn LLP

(57) ABSTRACT

A method of detecting the presence of an unsafe line condition at a power metering device is disclosed. The method comprises the steps of determining if a disconnect switch is in the open position, and measuring a first voltage at a first load contact. The method measures a second voltage at a second load contact and determines if the first voltage is greater than a first voltage threshold or less than a second voltage threshold. The method further determines if the second voltage is greater than the first voltage threshold or less than the second voltage threshold. The method indicates that an unsafe condition exists if either the first voltage is greater than the first voltage threshold, or first voltage is less than the second voltage threshold or the second voltage is greater than the first voltage threshold or the second voltage is less than the second voltage threshold, when the disconnect switch is in the open position.

26 Claims, 5 Drawing Sheets

U.S. PATENT DOCUMENTS

| | | | |
|---|---|---|---|
| 4,980,836 | A | 12/1990 | Carter et al. |
| 4,999,730 | A | 3/1991 | Pickard |
| 5,086,292 | A | 2/1992 | Johnson et al. |
| 5,293,115 | A | 3/1994 | Swanson |
| 5,345,225 | A | 9/1994 | Davis |
| 5,422,565 | A | 6/1995 | Swanson |
| 5,473,322 | A | 12/1995 | Carney |
| 5,488,565 | A | 1/1996 | Kennon et al. |
| 5,523,559 | A | 6/1996 | Swanson |
| 5,553,094 | A | 9/1996 | Johnson et al. |
| 5,903,064 | A | 5/1999 | Norberg |
| 5,940,009 | A | 8/1999 | Loy |
| 6,429,643 | B1 | 8/2002 | Smith |
| 7,091,878 | B2 | 8/2006 | Holle et al. |
| 7,746,054 | B2 | 6/2010 | Shuey |
| 7,772,829 | B2 | 8/2010 | Shuey |
| 2004/0150384 | A1 | 8/2004 | Holle et al. |
| 2007/0247789 | A1 | 10/2007 | Benson |
| 2008/0204953 | A1 | 8/2008 | Shuey |

FOREIGN PATENT DOCUMENTS

| | | |
|---|---|---|
| GB | 2260415 | 4/1993 |
| NZ | 507777 | 9/2003 |
| NZ | 554164 | 5/2010 |
| WO | WO 99/58987 | 11/1999 |

OTHER PUBLICATIONS

U.S. Appl. No. 12/148,578: Office Action dated Dec. 23, 2009.
U.S. Appl. No. 12/080,210: Notice of Allowance dated Dec. 15, 2009.
U.S. Appl. No. 11/710,837: Office Action dated Sep. 30, 2009.
U.S. Appl. No. 11/710,837: Response as filed Dec. 30, 2009.
New Zealand Patent Application No. 554164: Examination Report dated Apr. 15, 2009.

SYSTEM AND METHOD FOR DETECTING THE PRESENCE OF AN UNSAFE LINE CONDITION IN A DISCONNECTED POWER METER

CROSS-REFERENCE TO RELATED APPLICATION

This application is a continuation of U.S. patent application Ser. No. 11/710,837, filed Feb. 26, 2007, entitled "SYSTEM AND METHOD FOR DETECTING THE PRESENCE OF AN UNSAFE LINE CONDITION IN A DISCONNECTED POWER METER," which is herein incorporated by reference in its entirety.

TECHNICAL FIELD

The present invention relates generally to power systems, and more particularly to a method and apparatus for detecting the presence of a load side voltage on a disconnected power meter.

BACKGROUND

Utility companies use power meters to regulate and monitor power usage. Early power meters were electromechanical in nature converting the flow of electricity through the power meter into mechanical movement. The mechanical movement was used to turn a recording device which recorded the amount of energy being used. As technology improved over the years, the design of the power meter incorporated new innovations such as increased processing capability within the meter, elimination of mechanical parts, better accuracy and the like.

The utility company has the ability to connect or disconnect the subscriber from the electrical grid by opening or closing a service disconnect switch located at the power meter. In older power meters, the disconnect switch was located outside the metering device and was operated manually by a utility service technician. If the subscriber failed to pay the utility company for his power usage, the utility company could discontinue power service by opening the service disconnect switch. Alternatively, if service work was being performed on the meter or subscriber location, the utility company may elect to disconnect the subscriber from the electrical service grid by opening the service disconnect switch.

As the power meter has evolved, the service disconnect switch was incorporated into the power meter design. By integrating the service disconnect switch into the power meter, the utility company was able to take advantage of the some of the new advancements of the power meter itself such as remote operation and communication. Remotely operating the integrated service disconnect switch removes the need for manual intervention for disconnecting power to the subscriber. Once the disconnect switch is opened, the flow of electricity to the subscriber is interrupted.

After the flow of electricity to the subscriber is interrupted, the utility company typically monitors the conditions at the subscriber's power meter. Specifically, the utility company monitors the subscriber's line conditions to check for any abnormalities. If the utility company detects that the customer is still receiving power, the subscriber may have tampered with and possibly installed a bypass around the power meter. Alternatively, the subscriber may be receiving power by tapping into another subscriber's power service. The tapped subscriber may not even know he is losing power. In yet another scenario, the subscriber may be using a gas powered generator or other power source to generate power which may create a hazardous line condition.

If the utility company detects the presence of a load side voltage when the service disconnect switch is open, the utility company may initiate appropriate action. For example, if the utility company determines that the customer has bypassed the power meter, a utility craftsperson may be dispatched to the customer premise to verify the theft of power. If an alternate power source is detected, the utility company may continue to monitor the power meter. Should the service disconnect switch be closed without removing the alternate voltage source, a dangerous line condition may exist. Before closing the service disconnect switch, the utility company may notify the customer that an alternate voltage source has been detected and that before power can be restored, the alternative power source must be removed.

Commonly, power meters were designed to detect the tapping of each source contacts directly to the load contacts. However these previous designs may not be able to detect when the consumer has cross-tapped the power meter. In addition, these previous power meters may not be able to detect when an alternative power source is connected to the load side of the disconnected power meter.

SUMMARY

Accordingly, there exists a need in the industry to have a power metering system that can detect the presence of a load side voltage when the power meter is disconnected from the power grid. The load side voltage may be due to the input leads being tapped/cross-tapped to the output leads or possibly from an alternative power source. By detecting the presence of a load side voltage, the utility company may prevent the reconnection of the power meter until the load side voltage is removed. The present disclosure recognizes this need and discloses such a device.

A method for detecting the presence of an unsafe condition at a power metering device is disclosed. The power metering device is interposed between a voltage source and a load, the power metering device is connected to the load at a first load contact and a second load contact, the power metering device also having a disconnect switch. The disconnect switch has an open position, wherein the disconnect switch disables power from flowing through the power metering device from the power source to the load when the disconnect switch is in the open position. The method determines if the disconnect switch is in the open position. The method measures a first voltage at the first load contact and measures a second voltage at said second load contact. The method further determines if the first voltage is greater than a first voltage threshold or if the second voltage is less than a second voltage threshold. The method indicates that an unsafe condition exists if either the first voltage is greater than the first voltage threshold, or the first voltage is less than the second voltage threshold, or the second voltage is greater than the first voltage threshold, or the second voltage is less than the second voltage threshold, and the disconnect switch is in the open position.

Another method for detecting the presence of an unsafe condition at a power metering device is disclosed. The power metering device is interposed between a voltage source and a load, the power metering device is connected to the load at a first load contact and a second load contact, the power metering device having a disconnect switch, the disconnect switch operable between a closed position and an open position, the method comprising the steps of determining if the disconnect switch is in the closed position, operating the disconnect switch to the open position, measuring a first voltage at the first load contact. The method further measures a second voltage at the second load contact and determines if the first voltage is greater than a first voltage threshold or if the second voltage is less than a second voltage threshold. The method further indicates that an unsafe condition exists if either the first voltage is greater than the first voltage threshold, or the first voltage is less than the second voltage threshold or the second voltage is greater than the first voltage threshold, or the second voltage is less than the second voltage threshold.

An apparatus for detecting the presence of an unsafe condition at a power metering device is also disclosed. The power metering device is interposed between a voltage source and a load, the power metering device measuring power flowing from the source to the load, the apparatus comprising a disconnect switch. The disconnect switch is interposed between the load and the voltage source. The disconnect switch interrupts the power flow from the voltage source to the load when the disconnect switch is in an open position. The apparatus also having a load side voltage sensing circuit. The load side voltage sensing circuit is coupled to the load at a first load contact and a second load contact, the load side voltage sensing circuit measuring a first voltage at the first load contact and measuring a second voltage at the second load contact. The load side voltage sensing circuit determines if the first voltage is greater than a first voltage threshold or if the first voltage is less than a second voltage threshold, or if the second voltage is greater than a first voltage threshold, or if the second voltage is less than a second voltage threshold. The apparatus further having a processing circuit coupled to the disconnect switch and the load side voltage sensing circuit, the processing circuit determining if the disconnect switch is in the open position, the processing circuit indicating that an unsafe condition exists if either the first voltage is greater than the first voltage threshold, or the first voltage is less than the second voltage threshold, or the second voltage is greater than the first voltage threshold, or the second voltage is less than the second voltage threshold and, the disconnect switch is in the open position.

A more complete understanding of the present invention, as well as further features and advantages of the invention, will be apparent from the following detailed description and the accompanying drawings.

DETAILED DESCRIPTION OF ILLUSTRATIVE EMBODIMENTS

The detailed description set forth below in connection with the appended drawings is intended as a description of various embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention. For ease of illustration, all alternating current (AC) voltage values are represented in terms of root mean squared (RMS) values unless otherwise specified.

Figure 1:
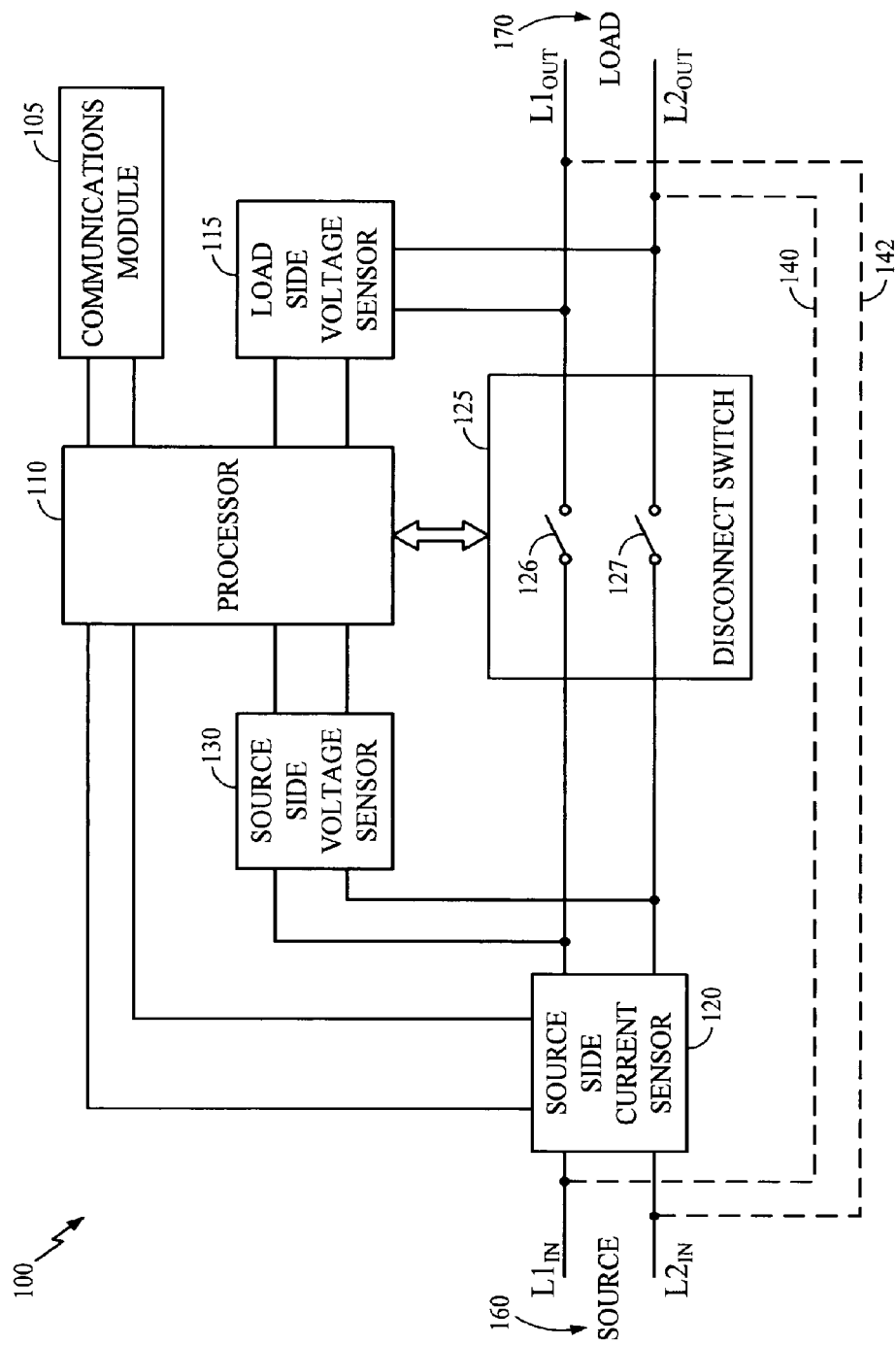
FIG. 1 shows a high level logic hardware block diagram of a power metering system using one embodiment of the present invention.

FIG. 1 displays a high level view of a power metering device 100 utilizing one embodiment of the present invention. The power meter device 100 is designed to receive a source line voltage at $L1_{IN}$ and $L2_{IN}$ at the source side 160 of the power metering device 100. The source voltage may be provided from the utility power grid, typically from a transformer near the subscriber site. The source voltage received at the source side 160 of the power metering device 100 typically ranges between 0 and 240 VAC. The power metering device 100 routes the electrical power through a current sensor 120. Coupled to the current sensor 120 is a service disconnect switch 125. Power is supplied to the load side 170 of the power meter through the service disconnect switch 125 when the service disconnect switch 125 is closed. From the service disconnect switch 125, power is routed to the subscriber via the $L1_{out}$ and $L2_{out}$ contacts.

Processing circuitry monitors the current sensor 120 as well as other components of the power metering device 100. In an exemplary embodiment the processing circuitry may be a processor 110 such as a Renesas H8/300 microprocessor. The current sensor 120 may have an internal analog to digital (A/D) converter allowing the processor 110 to receive a digital representation of the amount of the current flowing through the current sensor 120. Alternatively, another type of microprocessor may be used which has an internal A/D converter, with the current sensor 120 sending a analog voltage signal corresponding to the amount of current flowing through the current sensor 120 and the microprocessor performing its own A/D conversion.

Also coupled to the processor 110 is a source side voltage sensor 130. The source side voltage sensor is coupled directly between the current sensor 120 and the disconnect switch 125. The source side voltage sensor 130 monitors the voltage levels present at the source side 160 of the service disconnect switch 125. In one embodiment of the present invention, the source side voltage sensor 130 converts the voltage levels received to a corresponding digital representation which is presented to an input of the processor 110. In an alternative embodiment, the source side voltage sensor 130 may step the source side voltage down to a level that may be converted utilizing an internal A/D converter within the processor 110.

The processor 110 is coupled to the disconnect switch 125. The processor 110 may open or close the service disconnect switch 125 by opening and closing two electromechanical solenoid switches 126 and 127. Opening and closing the two electromechanical solenoid switches 126 and 127 allows the processor to connect or disconnect the subscriber from the power grid. During operation of the power metering device 100, the processor 110 monitors the position of the two electromechanical solenoid switches 126 and 127.

Connected to the load side 170 of the service disconnect switch 125 is a load side voltage sensor 115. The load side voltage sensor monitors the load side voltage presented to the subscriber at the $L1_{out}$ and $L2_{out}$ contacts. In short, the Processor 110 uses the load side voltage sensor 115 to monitor the conditions at the subscriber. A more detailed description of the load side voltage sensor 115 is discussed in reference to FIGS. 3-4.

The power metering device 100 has a communications module 105 which allows the utility company to communicate with the power metering device 100. In one exemplary embodiment, the communications module 105 may utilize cellular telephone technology to communicate with the utility company service center or craftsperson. In this embodiment, the craftsperson may use portable computer with a cellular telephone to connect with the meter to retrieve status or other useful information from the meter. The craftsperson may also be able to instruct the processor 110 to open and close the service disconnect switch 125 remotely. In an alternative embodiment, the communications module 105 may support other types of wireless communications. In yet another alternative embodiment, the power metering device 100 may be connected to a cable modem which in turn may be attached to the subscriber's cable line. In this example, the utility company may connect to the power metering device 100 by using TCP/IP or other networking protocols.

As mentioned previously, the utility company may monitor the subscriber line at the power metering device 100 to detect any abnormal line conditions. For example, should a subscriber not pay his/her utility bill, the utility company may decide to open the service disconnect switch 125 at the power metering device 100 and disconnect the subscriber from the power grid. Alternatively, the utility company may install a new power metering device 100 at a new home or apartment and open the service disconnect switch 125 to keep the power metering device 100 from delivering power to the new subscriber until an account is set up. In either of these cases, the utility company may continue to monitor the conditions at the subscriber line to ensure that before the service disconnect switch 125 is closed, there are no hazardous conditions on the subscriber's power lines.

In one illustrative example, a subscriber may attempt to bypass the power metering device 100 by connecting the load side 170 to the source side 160. More specifically, the subscriber may connect $L1_{IN}$ to $L1_{OUT}$ and $L2_{IN}$ to $L2_{OUT}$. Alternatively, as shown by the dashed lines 140 and 142 in FIG. 1, the subscriber may "cross tap" the connections of the power metering device 100 by connecting $L1_{IN}$ to $L2_{OUT}$ and $L2_{IN}$ to $L1_{OUT}$. Accordingly, it would be advantageous for the utility company to detect either of these types of tampering.

Figure 2:
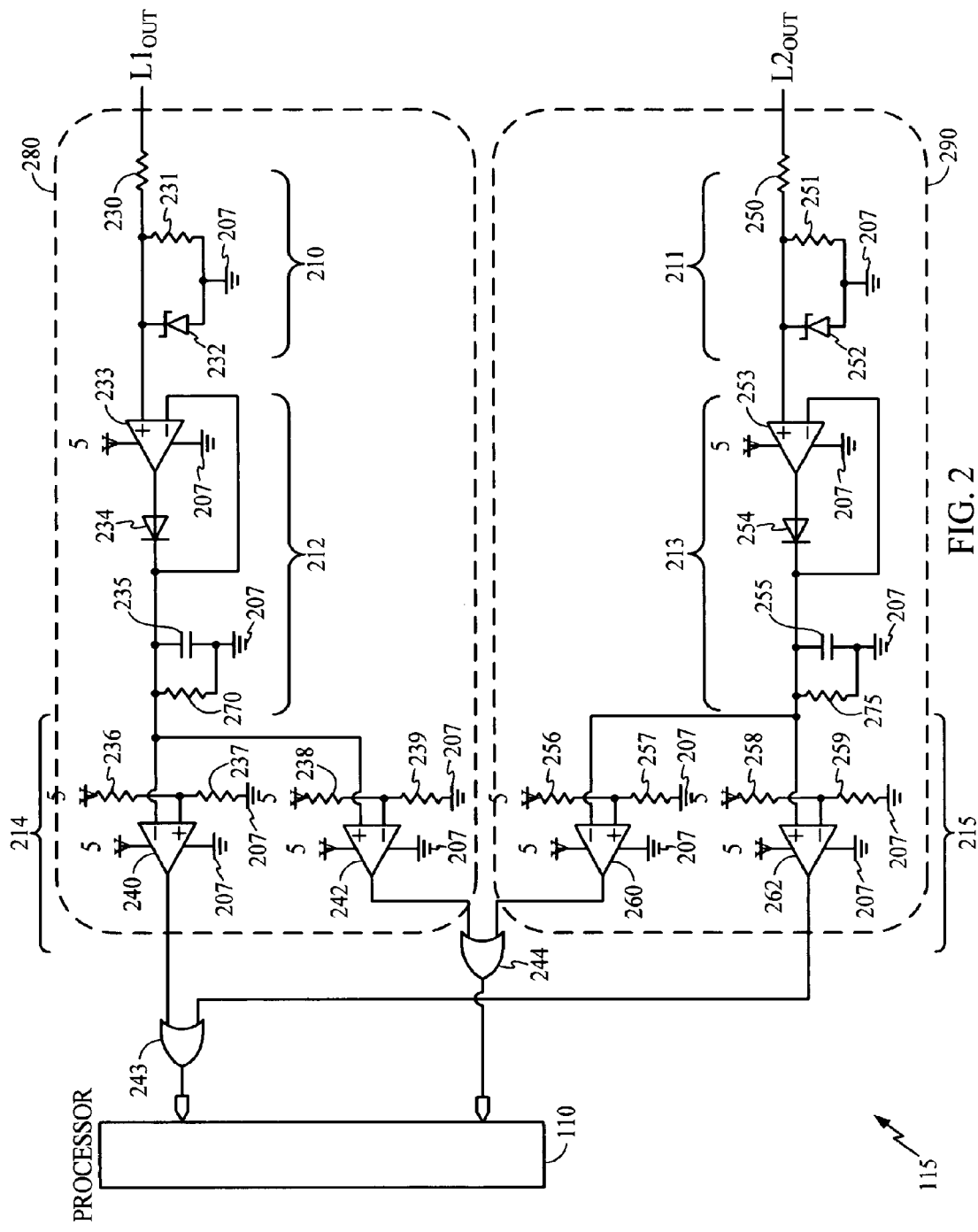
FIG. 2 displays a load side voltage detection circuit used by the power metering system of FIG. 1.

FIG. 2 displays an exemplary load side voltage sensor 115 in accordance with one aspect of the present invention. The load side voltage sensor 115 has two sets of circuitry 280 and 290 (each set of circuitry may also be referred to as a leg) connecting the processor 110 to each load side connection $L1_{OUT}$ and $L2_{OUT}$. As can be seen in FIG. 2, leg 280 is connected to $L1_{OUT}$ and leg 290 is connected to $L2_{OUT}$. As is explained in greater detail in subsequent sections, the circuitry in leg 280 detects if a voltage is either above a first threshold or below a second threshold on $L1_{OUT}$. Similarly, the circuitry in leg 290 detects if the voltage at $L2_{OUT}$ is greater than a first threshold or less than a second threshold. A power metering device 100 utilizing the load side voltage sensor 115 of FIG. 2 may detect when a subscriber has bypassed the power metering device 100 either by tapping or cross tapping from the source side 160 to the load side 170.

Each leg (280 and 290) has three main sections, a line voltage divider (210 and 211), a peak filter/buffer (212 and 213) and a comparator (214 and 215). The outputs of the comparators 214 and 215 are coupled to the inputs of OR gate 243 as well as OR gate 244. The output of the OR gates 243 as well as the OR gate 244 are directed to and monitored by the processor 110. It should be noted that in the embodiment as shown in FIG. 2, no external grounding is available within the power metering device 100. Instead, in this embodiment, the voltage present at $L2_{IN}$ is used as reference GND 207.

The voltage divider 210 of leg 280 comprises resister 230, resistor 231, and diode 232. The voltage divider 210 steps the line voltage received at $L1_{OUT}$ down to a level that may be more accurately measured by the comparator 214. In an exemplary embodiment resistor 231 may be a 7 KΩ ½ watt resister and resistor 230 may be a 1 MΩ ½ watt resister. The diode 232 protects the voltage divider 210 from any transients present at $L1_{out}$. The values for the resistors 230 and 231 may vary depending on the voltage present at $L1_{OUT}$ and $L2_{OUT}$. In one embodiment, the power metering device 100 is intended for use in North America where the voltage across $L1_{OUT}$ and $L2_{OUT}$ typically ranges between 0VAC and 240VAC. The inventive concepts as presented herein may be used in other environments including, but not limited to, European applications where the voltages may range between 0VAC and 480VAC.

The output of the voltage divider 210 is routed to the peak filter 212. The peak filter 212 comprises an op amp 233, a diode 234, a capacitor 235 and a resistor 270. The positive input of the op amp 233 receives the voltage signal from the voltage divider 210. The output of the op amp 233 is connected to diode 234 which keeps current from flowing back through the op amp 233. The output of the diode 234 is connected to capacitor 235, resistor 270 as well as the negative input of the op amp 240. The output of the peak filter is a DC voltage signal that may range from about 0VDC to about 3.0 VDC. In one exemplary embodiment, the capacitor 235 may be a 1.0 µF capacitor and the resistor 270 may be a 500KΩ ½ watt resister.

The comparator 214 is comprised of two op amps, 240 and 242. The output of the peak filter 212 is directed to the negative input of op amp 240 and the positive input of op amp 242. Connected to the positive input of op amp 240 are resistors 236 and 237. Coupled to the negative input of op amp 242 are resistors 238 and 239. As those skilled in the art may appreciate, the op amp 240 may turn on when the voltage at its negative input is at or drops below a lower threshold. The lower threshold for op amp 240 is determined by the voltage drop across resistor 237. In an exemplary embodiment, the resistor 236 may be a 100KΩ ½ watt resister and the resistor 237 may be a 11KΩ ½ watt resister. Using these values for resistor 236 and resistor 237, the voltage present at the positive input of op amp 240 is about 0.5 VDC. This corresponds to a threshold of about 50 VAC. Thus, when the voltage present at $L1_{OUT}$ is less than about 50 VAC, the voltage present at the negative input of op amp 240 is less than 0.5 VDC and the output of op amp 240 is driven high (to a logic "1"). As shown in FIG. 2, the output of op amp 240 is directed to one of the inputs of the OR gate 243. In one embodiment the output of op amp 240 continues to be driven high while the voltage remains below the threshold of 50 VAC. This condition may last as long as the source side 160 is bypassed to the load side 170.

Similarly, op amp 242 turns on when the voltage present at the positive input exceeds an upper threshold determined by the voltage drop across resistor 239. In an exemplary embodiment, resistor 238 may be a 100KΩ ½ watt resister and resistor 239 may be a 50 KΩ ½ watt resister. In this embodiment, the voltage present at the negative input of op amp 242 is about 1.7VDC, which corresponds to about 170 VAC present at $L1_{out}$. Thus when the voltage present at the $L1_{out}$ connector is above an upper threshold of about 170 VAC, the voltage present at the positive input of op amp 242 is about 1.7

VDC and the output of op amp 242 is driven high (to a logic "1"). The output of op amp 242 is directed to one of the inputs of OR gate 244.

The leg 290 is similar to the leg 280. In one embodiment, the leg 290 may be a duplicate copy of the leg 280. In this embodiment, the leg 290 detects the presence of a voltage that exceeds the upper threshold of about 170 VAC or lower threshold of less than 50 VAC at $L2_{out}$.

The voltage divider 211 of leg 290 comprises resister 250, resistor 251, and diode 252. The voltage divider 211 steps the line voltage at $L2_{out}$ down to a level that may be measured by the comparator 215 after passing through the peak filter 213. Thus, when the voltage present at the $L2_{out}$ connector is above the upper threshold of about 170 VAC, the voltage present at the positive input of op amp 262 is about 1.7 VDC and the output of op amp 262 is driven high (to a logic "1"). Similarly, when the voltage present at $L2_{out}$ is less than the lower threshold of about 50 VAC, the voltage present at the negative input of op amp 260 is less than 0.5 VDC and the output of op amp 260 is driven high (to a logic "1").

The peak filter 213 comprises an op amp 253, a diode 254, a capacitor 255 and a resistor 275. The positive input of the op amp 253 receives the voltage signal from the voltage divider 211. The output of the op amp 253 is connected to diode 254 which keeps current from flowing back through the op amp 253. The output of the diode 254 is connected to capacitor 255, resistor 275 as well as the negative input of the op amp 260 of comparator 215.

The comparator 215 is comprised of two op amps, 260 and 262. The output of the peak filter 213 is directed to the negative input of op amp 260 and the positive input of op amp 262. Connected to the positive input of op amp 260 are resistors 256 and 256. Coupled to the negative input of op amp 262 are resistors 258 and 259. As mentioned previously, the op amp 260 may turn on when the voltage at its negative input is at or drops below a lower threshold. The lower threshold for op amp 260 is determined by the voltage drop across resistor 257. Similarly, op amp 262 turns on when the voltage present at its positive input exceeds an upper threshold. The upper threshold is determined by the voltage drop across resistor 259.

The output of op amp 260 is directed to the other input of OR gate 244 while the output of op amp 262 is directed to the other input of OR gate 243. In this configuration, the output of OR gate 243 is coupled to an input on the processor 110 and is driven high when either the op amp 240 is driven high (i.e. the voltage at $L1_{OUT}$ is less than about 50 VAC), or the op amp 262 is driven high (i.e. the voltage at $L2_{OUT}$ is greater than about 170 VAC). Similarly, the output of OR gate 244 is connected to another input of the processor and is driven high when either the op amp 242 is driven high (the voltage at $L1_{OUT}$ is greater than about 170 VAC) or the op amp 260 is driven high (the voltage at $L2_{OUT}$ is less than about 50 VAC).

In the event that a power metering device 100 has been tampered with and possibly bypassed, the processor may monitor the output of both OR gate 244 as well as OR gate 243. When the output of OR gate 244 is high when the service disconnect switch 125 is open, the processor 110 may determine that the power metering device 110 may be bypassed at least at one of the load side contacts. Alternatively, if OR gate 243 is high while the service disconnect switch 125 is open, the processor 110 may determine that the power metering device 100 may be cross tapped at least at one of the other load side contacts. In either of these two cases, the utility company may determine that an abnormal line condition may be present at the load side 170 of the power metering device 100. In response to the abnormal line condition, the utility company may elect to send a craftsperson to investigate the abnormal line condition before the service disconnect switch is closed, and power is routed through the power metering device 100.

Figure 3:
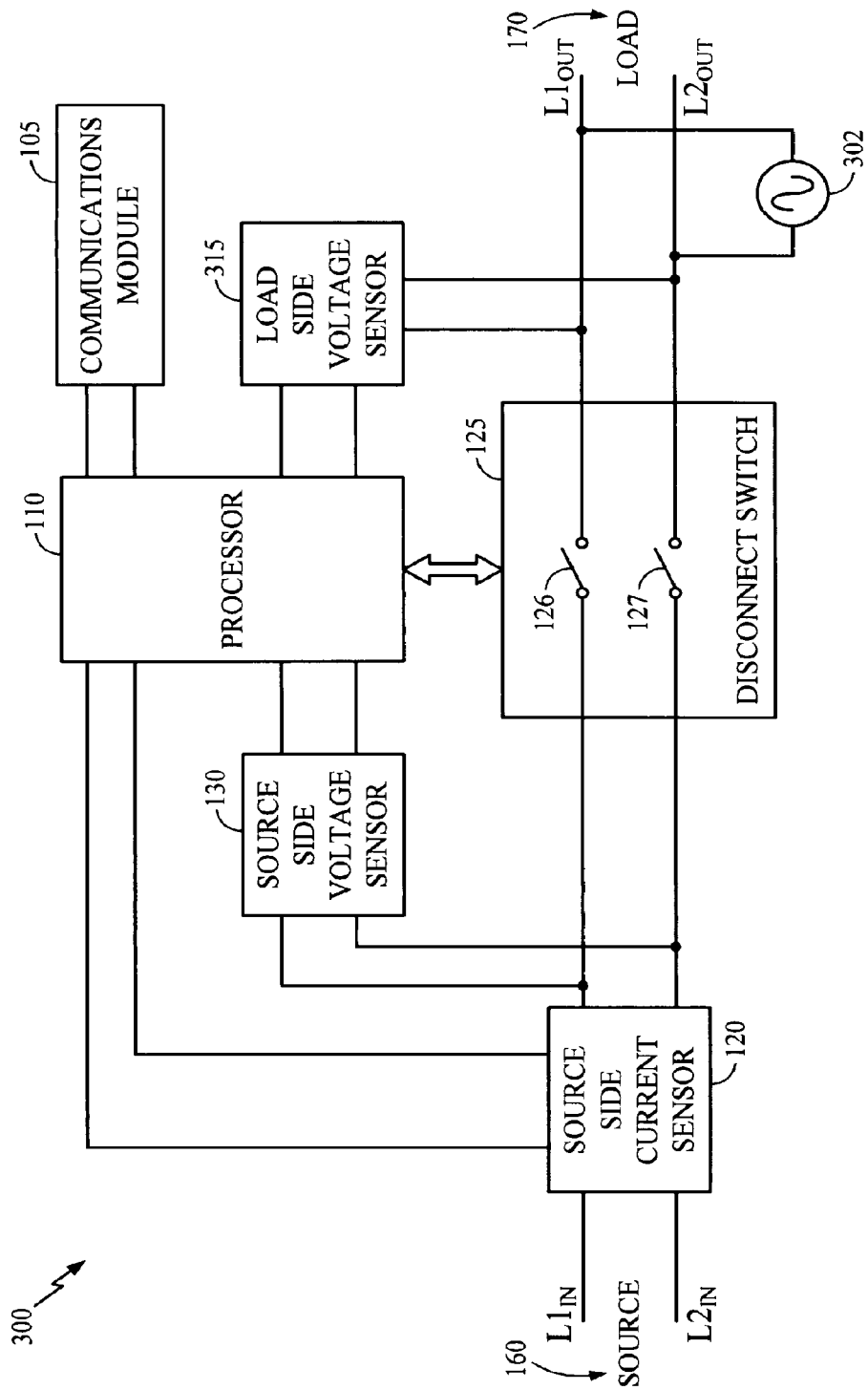
FIG. 3 displays a power metering system in accordance with another embodiment of the present invention.

FIG. 3 displays an alternate power metering device 300 designed to detect an alternative voltage source. The power metering device 300 is similar to the power metering device of FIG. 1 with the exception that the power metering device 300 has a load side voltage sensor 315 designed to detect the presence of other power sources source such as a portable electric generator 302. The portable electric generator 302 may attached to the load side 170 of the power metering device 300 and may be operating when the service disconnect switch 125 is open. Even though the operation of the electric generator 302 is not a theft of power or considered tampering with the power metering device 300, the utility company may not want to close the disconnect switch 125 until the electric generator 302 is no longer operating.

Typically the electric generator 302 is capable of controlling its output frequency within a +/− 3 Hz range. As the frequency of the electric generator drifts, the load side voltage signal as measured at $L1_{OUT}$ and $L2_{OUT}$ with respect to L2 results in a complex voltage waveform. The complex waveform may be described by the following equation: A sin X+A sin Y. This equation assumes that the amplitude of the waveforms is about the same. This equation may be simplified to: 2A cos(X−Y)/2·sin(X+Y)/2. The complex waveform has a low frequency beat at +/− 1.5 Hz as well as an approximate 60 Hz +/− 1.5 Hz characteristic.

Figure 5:
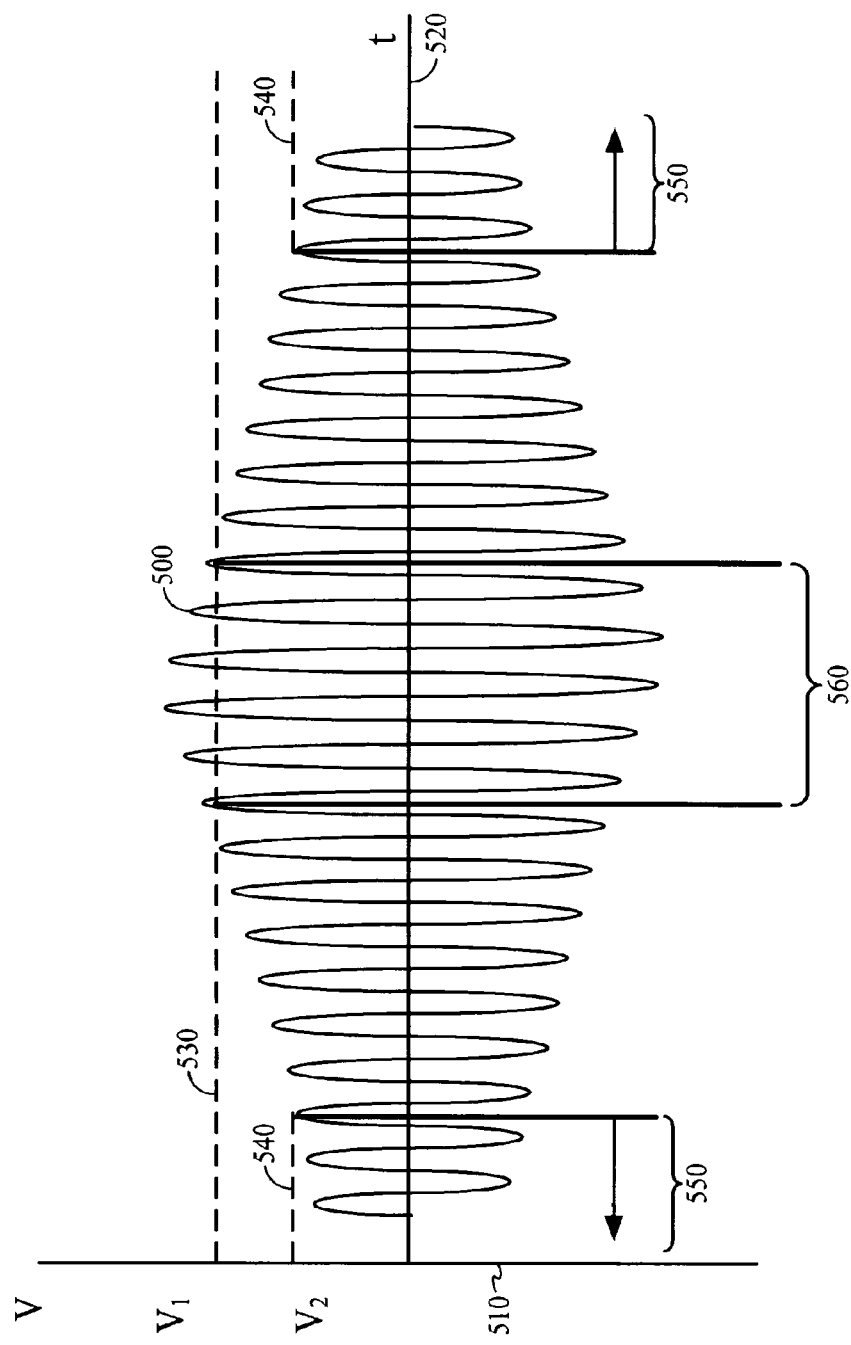
FIG. 5 displays an exemplary voltage waveform present at the load side of the power metering system of FIG. 3.

FIG. 5 displays an exemplary complex waveform 500 that may be present across the load side connections $L1_{OUT}$ and $L2_{OUT}$ with respect to $L2_{IN}$ caused by the electric generator 302. The amplitude of the complex waveform 500 is displayed on the Y-axis 510 and the time is displayed on the X-axis 520. As can be seen in FIG. 5, the amplitude of the complex waveform 500 varies over time. The frequency of the complex waveform 500 may also vary over time.

Figure 4:
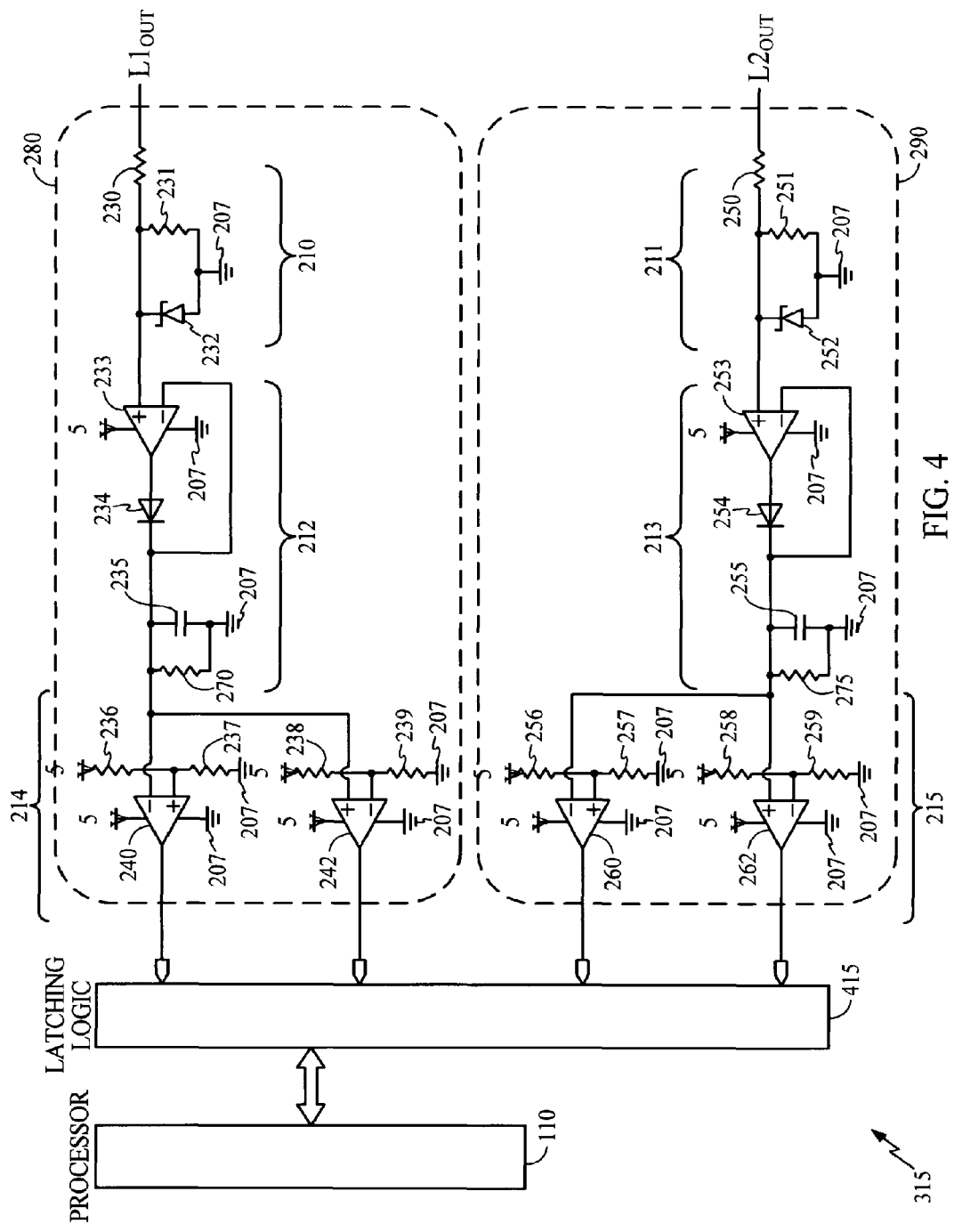
FIG. 4 shows an alternate load side voltage detection circuit used by the power metering system of FIG. 3 in accordance with another embodiment of the present invention.

A load side voltage sensor 315 in accordance with another embodiment of the present invention is displayed in FIG. 4. The load side voltage sensor 315 operates in a similar fashion to the load side voltage sensor 115 of FIG. 2 with the addition of latching logic 415, but without the OR gates 243 and 244. As described previously in the case of bypassing or cross tapping the power metering device 100, the voltage measured at $L1_{OUT}$ and $L2_{OUT}$ may cause the outputs of comparators 214 and 215 to remain on as long as the condition exists (i.e. as long as the source is connected to the load). In contrast, the voltage measured at $L1_{OUT}$ and $L2_{OUT}$ for power metering device 300 may occasionally exceed the upper voltage threshold V2 530 only for a short period of time. This is displayed at 560 in FIG. 5. Similarly, the voltage measured at $L1_{OUT}$ or $L2_{OUT}$ may occasionally fall below the lower threshold V1 540 for a short period of time (shown at 530).

Within load side voltage sensor 315, the circuitry associated with leg 280 (i.e. the voltage divider 210, the peak filter 212 and the comparator 214) measures the voltage at $L1_{OUT}$ with reference to $L2_{IN}$. If the voltage measured at $L1_{OUT}$ exceeds the upper threshold V2 530, the output of op amp 242 is driven high (to a logic "1"). The output of op amp 242 is received by the latching logic 415 and is subsequently stored. Similarly, if the voltage measured at $L1_{OUT}$ falls below the lower threshold 540, the output of op amp 240 is driven high. The output of op amp 240 is connected to the latching logic 415 which subsequently stores the occurrence. In one embodiment, the upper threshold is about 170 VAC and the lower threshold is about 50 VAC.

The purpose of the latching logic 415 is to capture the output of the op amps 240, 242, 260 and 262 and store the results. The results are eventually read and analyzed by the processor 110. As described previously, the load side voltage sensor 115 detects the presence of a load side voltage when there is a voltage that exceeds the upper threshold or a voltage that is below the lower threshold on either load side contact $L1_{out}$ and $L2_{out}$, as long as the abnormal line condition exists. Similarly, the voltage sensor 315 detects the presence of the load side voltage when the load side voltage exceeds the upper threshold on one of the load side contacts ($L1_{OUT}$ or $L2_{OUT}$) and a voltage is measured on the other load side contacts ($L1_{OUT}$ or $L2_{OUT}$) that is below the lower threshold. However, the presence of the abnormal line condition may not be detected continuously while the abnormal line condition exists. This is due to the fact that the complex waveform 500 may vary or fluctuate over time. As a result, the load side voltage sensor 315 detects each time that the voltage thresholds are met, keeps track of how often the voltage thresholds are met, and presents the information to the processor 110.

In one exemplary embodiment, the complex waveform 500 may only exceed the first threshold of about 170 VAC for 500 ms every 2 or 3 minutes. Alternatively, the complex waveform may only fall below the second threshold of about 50 VAC for 250 ms every 4-5 minutes.

In this example, the processor 110 may retrieve the results of the load side voltage sensor 315 every minute or two. Thus without the latching logic 415, the processor 110 may not detect that there may have been an extraneous voltage present.

In one embodiment, the latching logic may be D flip-flops designed to clock in a logic "1" each time the output of the op amps 240, 242, 260 and 262 are driven high. In this embodiment, the flip-flops are reset after being read by the processor 110. Alternatively, the latching logic 415 may be a series of flip-flops or possibly a counter that the processor 110 may read in order to determine how many times the thresholds were met over a certain amount of time. These flip-flops or register may also be reset after the processor has read them. In yet another embodiment, the latching logic 415 may comprise four one shot logic circuit (also referred to as a pulse timer) that latches the output of the op amps 240, 242, 260 and 262 individually and stays latched until reset by the processor 110. In another embodiment processor 110 may, through interrupts or periodic sampling, directly monitor the signals from op amps 240, 242, 260 and 262 and determine if a tamper condition exists or if a source of external power is present.

If the utility company determines that there may be an alternative source of power present on the power metering device 300 while the service disconnect switch 125 is open, the utility company may take appropriate action. For example, the utility company may simply continue to monitor the conditions at the power metering device 300 and delay the closing of the service disconnect switch until the condition has been removed. Alternatively, the utility company may send the subscriber a letter asking them to remove the alternative source of power before service will be restored. The utility company may send a service technician to the power metering device 300 to examine the line conditions at $L1_{OUT}$ and $L2_{OUT}$ to determine what may be causing the abnormality.

The various illustrative logical blocks, modules, circuits, elements, and/or components described in connection with the embodiments disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing components, e.g., a combination of a DSP and a microprocessor, a plurality of microprocessors, one or more microprocessors in conjunction with a DSP core, or any other such configuration.

Although specific embodiments have been illustrated and described herein, those of ordinary skill in the art appreciate that any arrangement, which is calculated to achieve the same purpose, may be substituted for the specific embodiments shown and that the invention has other applications in other environments. This application is intended to cover any adaptations or variations of the present invention. The following claims are in no way intended to limit the scope of the invention to the specific embodiments described herein.

What is claimed:

1. A method for detecting the presence of an unsafe condition at a power metering device, said power metering device interposed between a voltage source and a load, said power metering device connecting to said voltage source at a first source contact and a second source contact, and said power metering device connecting to said load at a first load contact and a second load contact, said power metering device having a disconnect switch, said disconnect switch having an open position, said disconnect switch disabling power from flowing through said power metering device from the voltage source to the load when the disconnect switch is in the open position, the method comprising:

determining if the disconnect switch is in the open position, measuring a first voltage at said first load contact with respect to a non-zero alternating current (AC) voltage at one of said source contacts;

measuring a second voltage at said second load contact with respect to the non-zero AC voltage at said one of said source contacts;

determining if the first voltage is greater than a first voltage threshold or less than a second voltage threshold;

determining if the second voltage is greater than the first voltage threshold or less than the second voltage threshold;

indicating that an unsafe condition exists if either:

a) the first voltage is greater than the first voltage threshold; or, b) the second voltage is less than the second voltage threshold; or, c) the second voltage is greater than the first voltage threshold; or d) the first voltage is less than the second voltage threshold; and, the disconnect switch is in the open position.

2. The method of claim 1 wherein the first voltage or the second voltage exist due to tapping of the power metering device.

3. The method of claim 1 wherein the first voltage or the second voltage exist due to cross-tapping of the power metering device.

4. The method of claim 1 wherein the first voltage or the second voltage exist due to a portable electric generator.

5. The method of claim 1 wherein a load side voltage sensor is used to measure the first voltage and the second voltage.

6. The method of claim 1 wherein the first voltage threshold is about 170 VAC.

7. The method of claim 1 wherein the second voltage threshold is about 50 VAC.

8. The method of claim 1 further comprising the step of notifying a utility company that the unsafe condition exists.

9. The method of claim 1 further comprising the step of leaving the disconnect switch in the open position when the unsafe condition exists.

10. A method of detecting the presence of an unsafe condition at a power metering device, said power metering device interposed between a voltage source and a load, said power metering device connecting to said voltage source at a first source contact and a second source contact, and said power metering device connecting to said load at a first load contact and a second load contact, said power metering device having a disconnect switch, said disconnect switch operable between a closed position and an open position, the method comprising:
    determining if the disconnect switch is in the closed position,
    operating the disconnect switch to the open position if the disconnect switch is in the closed position,
    measuring a first voltage at the first load contact with respect to a non-zero alternating current (AC) voltage at one of said source contacts;
    measuring a second voltage at the second load contact with respect to the non-zero AC voltage at said one of said source contacts;
    determining if the first voltage is greater than a first voltage threshold or less than a second voltage threshold;
    determining if the second voltage is greater than the first voltage threshold or less than the second voltage threshold;
    indicating that an unsafe condition exists if either:
        a) the first voltage is greater than the first voltage threshold; or,
        b) the second voltage is less than the second voltage threshold; or,
        c) the second voltage is greater than the first voltage threshold; or,
        d) the first voltage is less than the second voltage threshold.

11. The method of claim 10 wherein the first voltage or the second voltage exist due to tapping of the power metering device.

12. The method of claim 10 wherein the first voltage or the second voltage exist due to cross-tapping of the power metering device.

13. The method of claim 10 wherein the first voltage or the second voltage exist due to a portable electric generator.

14. The method of claim 10 wherein a load side voltage sensor is used to measure the first voltage and the second voltage.

15. The method of claim 10 wherein the first voltage threshold is about 170 VAC.

16. The method of claim 10 wherein the second voltage threshold is about 50 VAC.

17. The method of claim 10 further comprising the step of notifying a utility company that the unsafe condition exists.

18. The method of claim 10 further comprising the step of leaving the disconnect switch in the open position when the unsafe condition exists.

19. An apparatus for detecting the presence of an unsafe condition at a power metering device, the power metering device interposed between a voltage source and a load, the power metering device connecting to said voltage source at a first source contact and a second source contact, the power metering device measuring power flowing from the voltage source to the load, the apparatus comprising:
    a disconnect switch, the disconnect switch interposed between the load and the voltage source, the disconnect switch interrupting the flow of power from the voltage source to the load when the disconnect switch is in an open position;
    a load side voltage sensing circuit, the load side voltage sensing circuit coupled to the load at a first load contact and a second load contact, the load side voltage sensing circuit measuring a first voltage at the first load contact with respect to a non-zero alternating current (AC) voltage at one of said source contacts and measuring a second voltage at the second load contact with respect to the non-zero AC voltage at said one of said source contacts, the load side voltage sensing circuit determining:
        a) if the first voltage is greater than a first voltage threshold, or
        b) if the first voltage is less than a second voltage threshold, or
        c) if the second voltage is greater than the first voltage threshold, or
        d) if the first voltage is less than the second voltage threshold; and,
    a processing circuit coupled to the disconnect switch and the load side voltage sensing circuit, the processing circuit determining if the disconnect switch is in the open position, the processing circuit indicating that an unsafe condition exists when either the first voltage is greater than the first voltage threshold, or the first voltage is less than the second voltage threshold, or the second voltage is greater than the first voltage threshold or the second voltage is less than the second voltage threshold, and the disconnect switch is in the open position.

20. The apparatus of claim 19 wherein the first voltage or the second voltage is caused by tapping the power metering device.

21. The apparatus of claim 19 wherein the first voltage or the second voltage is caused by cross-tapping the power metering device.

22. The apparatus of claim 19 wherein the first voltage or the second voltage is caused by a portable electric generator.

23. The apparatus of claim 19 wherein the first voltage threshold is about 170 VAC.

24. The apparatus of claim 19 wherein the second voltage threshold is about 50 VAC.

25. The apparatus of claim 19 further comprising a notification circuit, the notification circuit notifying a utility company that the unsafe condition exists.

26. The apparatus of claim 19 wherein the processing circuit is configured to cause the disconnect switch to change from the open position to a closed position after the unsafe condition no longer exists.

* * * * *